(12) United States Patent
Gebreselasie et al.

(10) Patent No.: US 8,054,597 B2
(45) Date of Patent: Nov. 8, 2011

(54) ELECTROSTATIC DISCHARGE STRUCTURES AND METHODS OF MANUFACTURE

(75) Inventors: Ephrem G. Gebreselasie, South Burlington, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 12/489,774

(22) Filed: Jun. 23, 2009

(65) Prior Publication Data

US 2010/0321842 A1    Dec. 23, 2010

(51) Int. Cl.
*H02H 3/22* (2006.01)
(52) U.S. Cl. .......................................... 361/56; 361/111
(58) Field of Classification Search .................... 361/56, 361/111; 257/355–360
See application file for complete search history.

(56) References Cited

U.S. PATENT DOCUMENTS

| | | | |
|---|---|---|---|
| 5,703,747 A | 12/1997 | Voldman et al. | |
| 5,901,022 A | 5/1999 | Ker | |
| 5,973,396 A | 10/1999 | Farnworth | |
| 6,313,512 B1 | 11/2001 | Schmitz et al. | |
| 6,608,363 B1 | 8/2003 | Fazelpour | |
| 6,975,032 B2 | 12/2005 | Chen et al. | |
| 7,265,433 B2 | 9/2007 | Pillai et al. | |
| 7,335,972 B2 | 2/2008 | Chanchani | |
| 7,355,273 B2 | 4/2008 | Jackson et al. | |
| 2001/0010964 A1 | 8/2001 | Geissler et al. | |
| 2002/0113267 A1 | 8/2002 | Brown et al. | |
| 2004/0195651 A1 | 10/2004 | Zhang et al. | |
| 2004/0238894 A1 | 12/2004 | Furuta | |
| 2005/0266673 A1 | 12/2005 | Hu et al. | |
| 2005/0282381 A1 | 12/2005 | Cohen et al. | |
| 2007/0029646 A1 | 2/2007 | Voldman | |
| 2007/0296055 A1 | 12/2007 | Yen et al. | |
| 2008/0073747 A1 | 3/2008 | Chao et al. | |
| 2008/0254572 A1 | 10/2008 | Leedy | |
| 2009/0283898 A1* | 11/2009 | Janzen et al. | 257/698 |
| 2010/0244187 A1* | 9/2010 | Voldman | 257/531 |

OTHER PUBLICATIONS

Hsiao et al., "Ultra Low-Capacitance Bond Pad for RF Applications in CMOS Technology", 2007 IEEE Radio Frequency Integrated Circuits Symposium, pp. 303-306.
Hsiao et al., "Bond Pad Design With Low Capacitance in CMOS Technology for RF Applications", IEEE Electron Device Letters, vol. 28, No. 1, Jan. 2007, pp. 68-70.

* cited by examiner

*Primary Examiner* — Danny Nguyen
(74) *Attorney, Agent, or Firm* — Anthony Canale; Roberts Mlotkowski Safran & Cole, P.C.

(57) ABSTRACT

Electrostatic discharge (ESD) structures having a connection to a through wafer via structure and methods of manufacture are provided. The structure includes an electrostatic discharge (ESD) network electrically connected in series to a through wafer via. More specifically, the ESD circuit includes a bond pad and an ESD network located under the bond pad. The ESD circuit further includes a through wafer via structure electrically connected in series directly to the ESD network, and which is also electrically connected to VSS.

16 Claims, 5 Drawing Sheets

ELECTROSTATIC DISCHARGE STRUCTURES AND METHODS OF MANUFACTURE

FIELD OF THE INVENTION

The invention generally relates to electrostatic discharge (ESD) structures and methods of manufacture and, more particularly, to ESD structures having a connection to a through wafer via structure and methods of manufacture.

BACKGROUND

Electrostatic Discharge (ESD) events are a common issue in semiconductor devices. For example, an ESD event to one or more pins of an integrated circuit package can damage or destroy the semiconductor device. More specifically, ESD-related failures can be exhibited in a number of ways such as, for example, junction leakage, short, or burn-out; dielectric rupture; resistor-metal interface rupture; and resistor/metal fusing, to name a few. These failures are especially true in sensitive devices such as, for example, a MOS device which has thin gate oxides.

There are three predominant ESD models for integrated circuits. These models include the Human Body Model (HBM), the Charged Device Model (CDM), and the Machine Model (MM). The HBM simulates the ESD event when a person charged to a positive potential or negative potential contacts an integrated circuit which is at a different potential. The CDM, on the other hand, simulates the ESD event that occurs when a device charges to a certain potential, and contacts with a conductive surface at a different potential. The MM simulates the ESD event that occurs when a part of an equipment or tool comes into contact with a device at a different potential.

To prevent ESD occurrences, ESD devices are formed with and connected to semiconductor devices in order to protect the devices. The ESD devices operate to absorb an electrostatic discharge and bring it to ground to avoid damage to or destruction of the semiconductor device. However, ESD devices are typically very large devices that utilize valuable space on a chip. In current technology, this poses an issue since such chip space is at a premium, especially in 90 nm nodes and less. Also, known ESD devices have a tendency to fail due to thin underpass connection during ESD events.

Accordingly, there exists a need in the art to overcome the deficiencies and limitations described hereinabove.

SUMMARY

In a first aspect of the invention, a structure comprises an electrostatic discharge (ESD) network in series and electrically connected to a through wafer via.

In another aspect of the invention, an ESD circuit comprises a bond pad and an ESD network located under the bond pad. The ESD circuit further comprises a through wafer via structure electrically connected in series directly to the ESD network, and which is also electrically connected to VSS.

In yet another aspect of the invention, a method of manufacturing an ESD network comprises: forming a bond pad above an interlevel dielectric layer; forming an ESD element having an inductive coil under the bond pad, in the interlevel dielectric layer; and forming a through via structure by lithographic, etching and deposition processes. The through via structure is electrically connected to the inductive coil.

In another aspect of the invention, there is a design structure tangibly embodied in a machine readable medium used for designing, manufacturing, or testing an integrated circuit. The design structure includes the method steps and/or structure of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to electrostatic discharge (ESD) structures and methods of manufacture and, more particularly, to ESD structures having a connection to a through wafer via structure and methods of manufacture. Advantageously, the present invention provides a low area, low resistance inductive shunt ESD network using, for example, a structure under a bond pad which is connected directly to the substrate by the through wafer via structure.

In more specific embodiments, the ESD network includes an ESD inductor connected to the substrate by the through wafer via structure. In embodiments, the ESD inductor can be an inductive coil connected to the through wafer via structure to provide a low resistance path to ground. In embodiments, the inductive coil provides a low current density and low resistance path for applications such as, for example, RF ESD applications. In further embodiments, the ESD structure is provided under a wafer bond pad, which eliminates the need to use additional valuable chip space. In still further embodiments, the ESD structure includes an inductor shield structure to isolate the surrounding area from eddy currents which may be generated from the ESD inductor structure.

Figure 1:
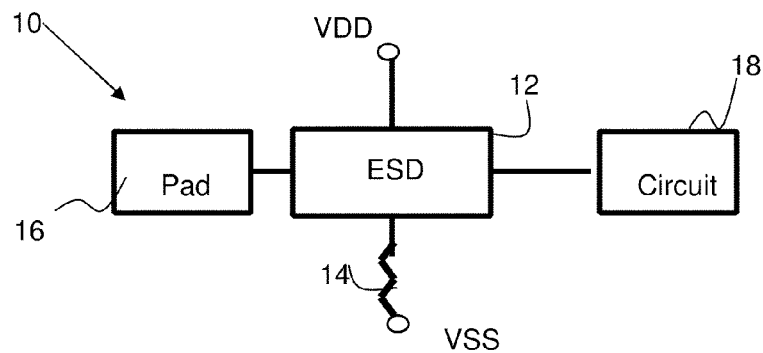
FIGS. 1-3 show circuit diagrams in accordance with aspects of the invention.

FIG. 1 shows a circuit diagram in accordance with an aspect of the invention. More specifically, FIG. 1 shows a structure 10 having an ESD device 12 (also referred to as an ESD network) electrically connected, in series, to VSS (ground) by a through wafer via structure 14. The ESD device 12 is also electrically connected in series to VDD (e.g., power rail). In embodiments, the ESD device 12 can be, for example, a MOSFET, diode or a series of diodes. The through wafer via structure 14 may be a through wafer silicon via structure. The structure 10 also includes a circuit 18 (e.g., silicon circuit), which is protected by the ESD device 12.

It should be recognized by those of skill in the art that the ESD device 12 is arranged substantially parallel to the substrate, and is located under the bond pad 16. Accordingly, compared to conventional circuits, the area under the bond pad 16 is now being utilized to more efficiently use available space. In this way, the ESD device 12 is a back-side electrical film for current distribution of ESD events.

More specifically and advantageously, the electrical connection to VSS (e.g., ground or substrate rail) by the through wafer via structure 14 eliminates the need for additional silicon elements which, in turn, preserves valuable chip space. (In conventional ESD networks, VDD and VSS were connected by a silicon device; compared to the present invention which eliminates the requirement for such a connection.) Also, the through wafer via structure 14 provides a low resistance path to the substrate, thus increasing the robustness of the ESD device 12. In embodiments, this is due to the fact that the through wafer via structure 14 has an ultra low resistance that can carry the current to ground, independent of the substrate resistance. Thus, in embodiments, the through wafer via structure 14 will substantially reduce the discharge to the substrate.

Figure 2:
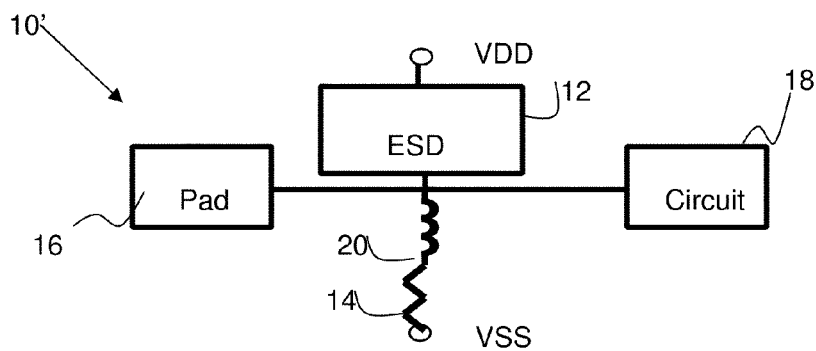

FIG. 2 shows another circuit diagram in accordance with an aspect of the invention. More specifically, FIG. 2 shows a structure 10' having an ESD device 12 with an inductive coil 20. The inductive coil 20 is electrically connected, in series, directly to the through wafer via structure 14 which, in turn, is electrically connected, in series, to VSS. The ESD device 12 is also electrically connected, in series, to VDD. In embodiments, the ESD device 12 can include, for example, a MOSFET, a diode or a series of diodes. The ESD device 12 can also be located under the bond pad 16, with a circuit 18 that is protected by the ESD device 12.

As discussed with reference to FIG. 1, the through wafer via structure 14 provides a low resistance path to the substrate, thus increasing the robustness of the ESD device 12. In the embodiment of FIG. 2, though, the addition of the inductive coil 20 will also increase the robustness of the ESD device 12. Thus, the combination of the inductive coil 20 and through wafer via structure 14 will effectively provide an improved ESD robustness for VSS shunts through a low resistance path.

In embodiments, the inductive coil 20 has a low resistance (e.g., less than about 10 ohms) and, in embodiments, is structured to carry a current of about 1 amp to about 10 amps. In specific embodiments, the inductive coil 20 is a metal or metal alloy and more preferably copper or aluminum. In embodiments, copper has advantages over aluminum due to its higher melting point (e.g., about 1200° C. vs. 600° C.) and lower resistivity. In embodiments, the cross sectional area of the inductive coil 20 should be of such a dimension to prevent melting upon an application of current.

In specific embodiments, the inductive coil 20 (e.g., copper) can be about 2 microns wide by about 4 microns thick, for a 1600 volt human body model. In further embodiments, the cross sectional area of the inductive coil 20 can range from about 2 microns wide to about 8 microns wide and about 0.5 microns thick to about 4 microns thick; although other dimensions are also contemplated by the present invention. For example, the cross sectional area of the copper inductor can be about 4 microns wide and about 4 microns thick. The cross sectional area of the aluminum or other inductor material can have similar cross sectional areas, e.g., 4 microns wide by 4 microns thick, depending on the particular ESD requirements of the device.

Those of skill in the art should understand that the shunt impendence of the present invention should be as large as possible. In particular, at frequencies of about 5 GHz or faster, the ESD device should act as an open circuit. That is, at frequencies of about 5 GHz or faster, the shunt to ground should look infinite.

The length of the inductive coil 20 can vary, depending on the particular application. For example, the length can be calculated based on the engineered or desired current density of the inductive coil 20. By way of example, the total resistance is equal to the cross sectional area of the inductive coil times the length of the inductive coil, where the cross sectional area is proportional to the number of turns of the coil.

Figure 3:
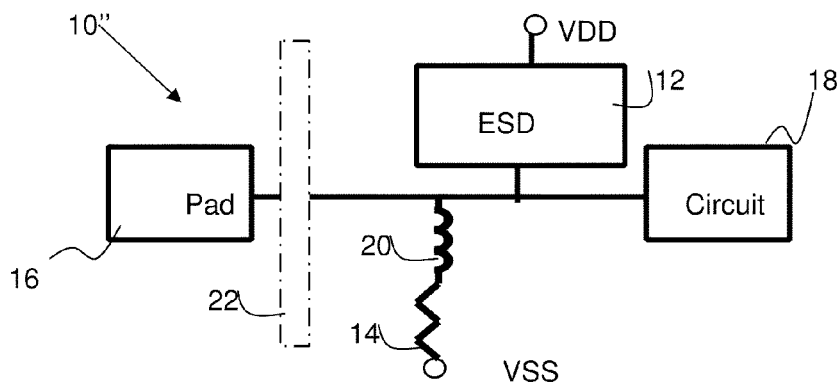

FIG. 3 shows another circuit diagram in accordance with an aspect of the invention. In the embodiment of FIG. 3, the structure 10" includes the elements of the structure 10' with the addition of an inductor shield structure 22. In embodiments, the inductor shield structure 22 can be, for example, a metal grating under the bond pad 16. The metal grating, the inductor shield structure, will prevent eddy currents in the substrate due to the magnetic field induced by the inductor coil 20. The inductor shield structure 22 can also be used in the embodiment of FIG. 1.

Figure 4:
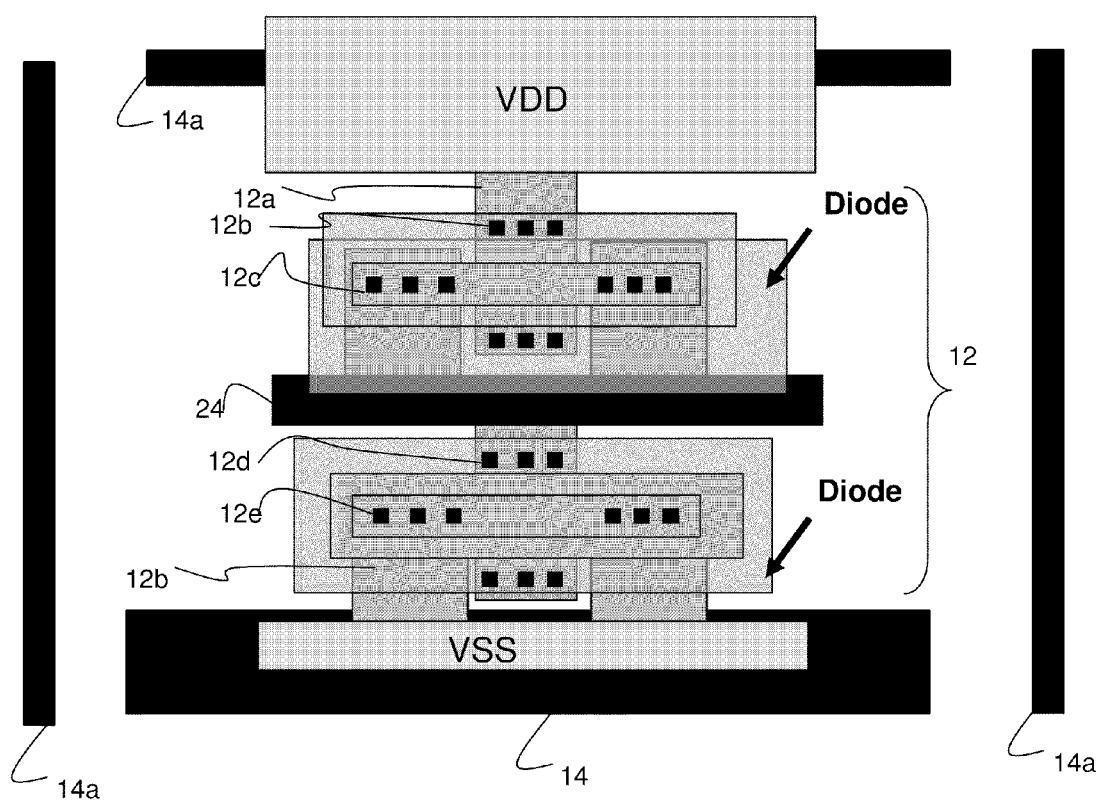
FIGS. 4-7 show structures in accordance with aspects of the invention.

FIG. 4 shows a structure in accordance with an aspect of the invention. More specifically, FIG. 4 shows an ESD device 12 electrically connected, in series, to VSS by the through wafer via structure 14. In embodiments, the through wafer via structure 14 is provided in a thin wafer film. More specifically, the through wafer via structure 14 can be formed by opening a via in a substrate (dielectric layer) using conventional lithographic and etching processes, and depositing a metal, for example, in the via.

In embodiments, the ESD device 12 is a series of diodes (or other ESD elements) formed in a substrate, electrically connected directly to the through wafer via structure 14 by a wiring bus 12a. The ESD device 12 is also electrically connected to VDD by the wiring bus 12a. More specifically, the upper diode is electrically connected to the VDD by one or more cathode connections 12b and to the input node 24 by one or more anode connections 12c. The lower diode is electrically connected to the input node 24 by one or more cathode connections 12d and to the through wafer via structure 14 by one or more anode connections 12e. The through wafer via structure 14, in turn, is electrically connected directly to VSS (in series) in order to discharge current to ground or a substrate rail.

FIG. 4 also shows a plurality of through wafer via structures 14a surrounding the circuit. The through wafer via structures 14a can be formed by opening a via in a substrate using conventional lithographic and etching processes, and depositing a metal, for example, in the via. The plurality of through wafer via structures 14a can act as isolation sources to prevent current injection into the substrate. This will, in turn, prevent noise, capacitance coupling between circuits, latch-up issues and substrate noise, for example.

Figure 5:
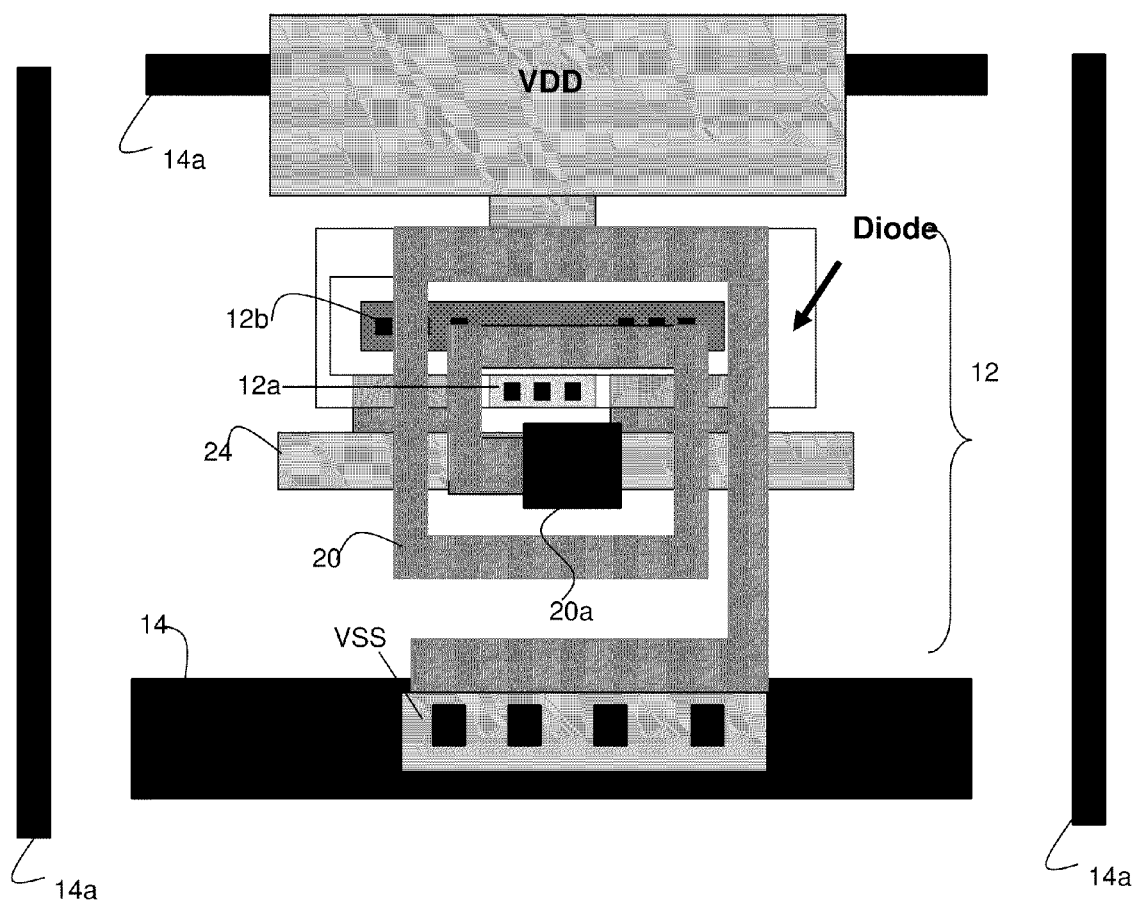

In the embodiment of FIG. 5, the ESD device 12 is represented by a single diode and the inductive coil 20. The conductive coil 20 can be a low resistance thick film deposited on the device in a conventional manner. More specifically, the inductive coil 20 can be formed in an interlevel dielectric using conventional lithographic, etching and deposition steps. The inductive coil 20 can be a metal such as, for example, copper or aluminum deposited in an opening formed through the etching process (e.g., RIE).

The conductive coil 20 has a width that provides low resistance and provides low current density to avoid melting during ESD events. The conductive coil 20 is electrically connected to an input node 24 by a contact 20a. The contact 20a can be representative of a via stack structure in the center of the conductive coil 20, which forms a vertical stack. The conductive coil 20 is also electrically connected, in series, to VSS by the through wafer via structure 14. In embodiments, the diode portion of the ESD device 12 is connected to the VDD by cathode connections 12b and to the input node 24 by anode connections 12c. The through wafer via structure 14, in turn, is connected to VSS in order to discharge current to ground or substrate rail.

Much like FIG. 4, the embodiment of FIG. 5 shows a plurality of through wafer via structures 14a surrounding the circuit. The plurality of through wafer via structures 14a can act as isolation sources to prevent current injection into the substrate. This will, in turn, prevent noise, capacitance coupling between circuits, latch-up issues and substrate noise, for example.

Figure 6:
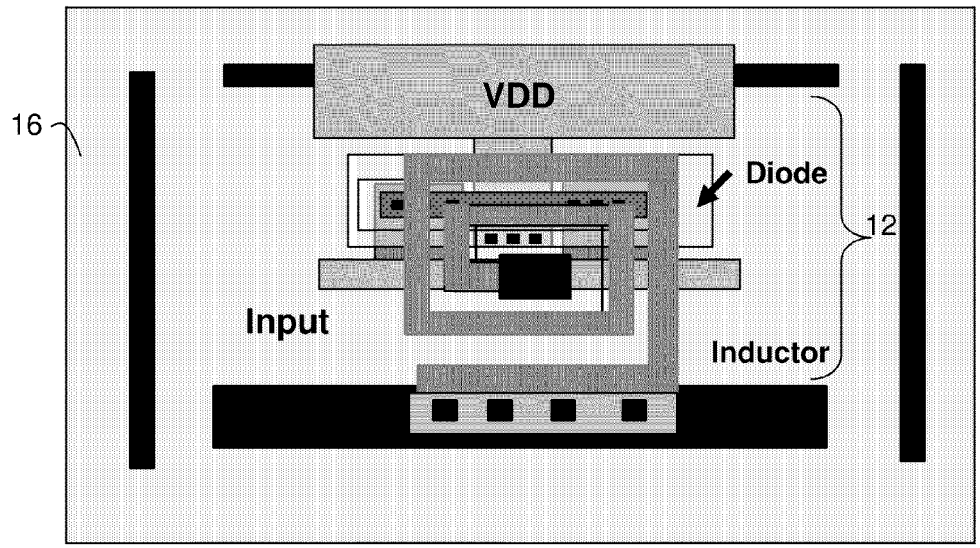

FIG. 6 shows the structure of FIG. 5 under the bond pad 16. More specifically, the embodiment shown in FIG. 6 shows the placement of the ESD device 12 under the bond pad in order to save chip area. In this way, the ESD device 12 is a back-side electrical film for current distribution of ESD events.

Figure 7:
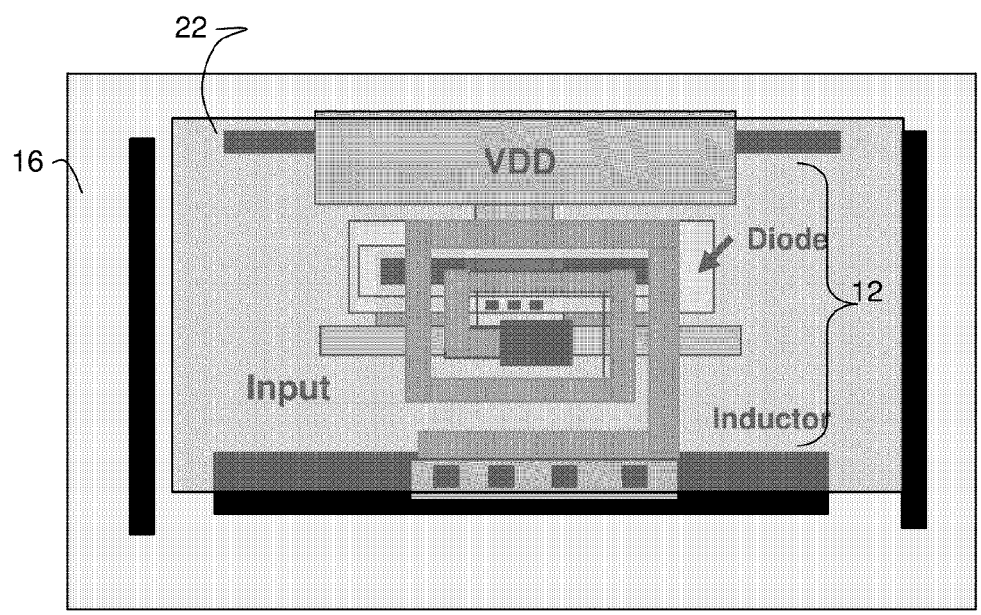

FIG. 7 shows the structure of FIG. 6 with the addition of the shield structure 22. As shown in FIG. 7, the shield structure 22 is placed between the bond pad 16 and the structure of FIG. 5. In further embodiments, the shield structure 22 can be above and below the inductor 20 to improve the "Q" of the inductor. In still further embodiments, the through wafer via structures are connected to via stacks that can penetrate the shield structure 22.

Figure 8:
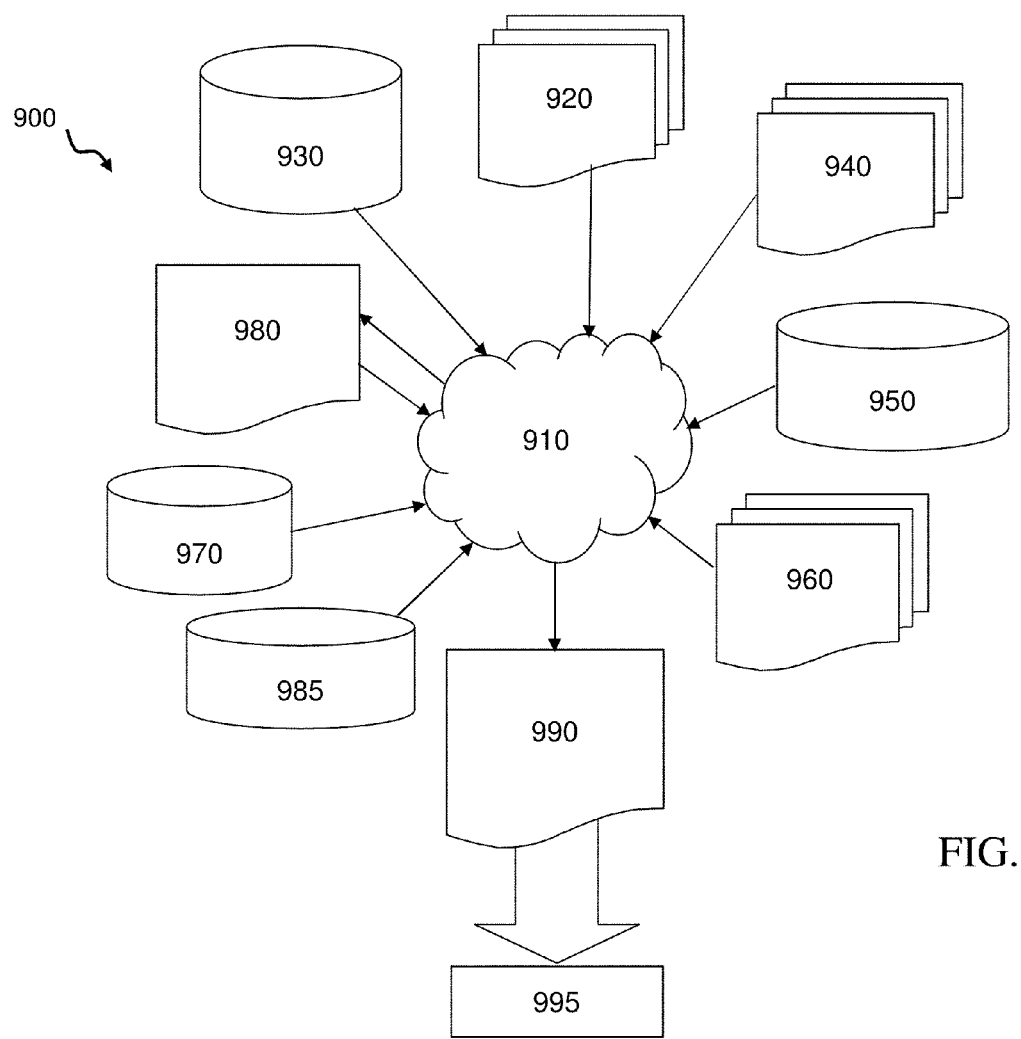
FIG. 8 is a flow diagram of a design process used in semiconductor design, manufacture, and/or test.

FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A structure comprising:
    an electrostatic discharge (ESD) network that is electrically connected in series to a through wafer via,
    wherein the ESD network includes an inductive coil that is positioned under a bond pad and the inductive coil has a resistance of less than about 10 ohms and is structured to carry a current of about 1 amp to about 10 amps.

2. The structure of claim 1, wherein the through wafer via is electrically connected directly to VSS.

3. The structure of claim 2, wherein the VSS is one of ground and a substrate rail.

4. The structure of claim 1, wherein the ESD network is located under a bond pad.

5. The structure of claim 1, wherein the ESD network is electrically connected to a power rail.

6. The structure of claim 1, wherein the ESD network includes at least one of a diode and MOSFET.

7. The structure of claim 1, further comprising a plurality of through wafer via structures surrounding the ESD network.

8. The structure of claim 1, further comprising a conductor shield to insulate a surrounding area from injection current.

9. An ESD circuit comprising:
    a bond pad;
    an ESD network located under the bond pad, the ESD network including an ESD element and an inductive coil; and
    a through wafer via structure electrically connected in series directly to the ESD network, and which is also electrically connected to VSS,
    wherein the inductive coil is one of copper and aluminum located under the bond pad and electrically connected in series directly to the through wafer via structure.

10. The ESD circuit of claim 9, wherein the inductive coil has a resistance of less than about 10 ohms and is structured to carry a current of about 1 amp to about 10 amps.

11. The ESD circuit of claim 9, further comprising a conductor shield located under the bond pad to insulate a surrounding area from injection current generated from the inductive coil.

12. The ESD circuit of claim 9, further comprising a plurality of through wafer via structures surrounding the ESD network.

13. An ESD circuit comprising:
    a bond pad;
    an ESD network located under the bond pad, the ESD network including an ESD element and an inductive coil; and
    a through wafer via structure electrically connected in series directly to the ESD network, and which is also electrically connected to VSS,
    wherein the inductive coil is about 2 microns wide to about 8 microns wide and about 0.5 microns thick to about 4 microns thick.

14. The ESD circuit of claim 9, wherein the ESD element and the inductive coil are electrically connected in series by an input node.

15. A method of manufacturing an ESD network, comprising:

forming a bond pad above an interlevel dielectric layer;
forming an ESD element having an inductive coil under the bond pad, in the interlevel dielectric layer; and
forming a through via structure by lithographic, etching and deposition processes, and which is electrically connected to the inductive coil,
wherein the inductive coil is formed by depositing a thin film of conductive material in the interlevel dielectric layer.

16. A structure comprising:
an electrostatic discharge (ESD) network that is electrically connected in series to a through wafer via,
wherein the ESD network includes:
a single diode; and
an inductive coil that is positioned under a bond pa, the inductive coil being a low resistance thick film.

* * * * *